US009720037B2

United States Patent
Ichiba et al.

(10) Patent No.: US 9,720,037 B2
(45) Date of Patent: Aug. 1, 2017

(54) DEBUG CIRCUIT, SEMICONDUCTOR DEVICE, AND DEBUG METHOD

(71) Applicant: FUJITSU LIMITED, Kawasaki-shi, Kanagawa (JP)

(72) Inventors: Toshiyuki Ichiba, Kawasaki (JP); Yoshinori Tomita, Yokohama (JP); Yutaka Tamiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/085,298

(22) Filed: Mar. 30, 2016

(65) Prior Publication Data
US 2016/0327610 A1 Nov. 10, 2016

(30) Foreign Application Priority Data
May 7, 2015 (JP) .................... 2015-094556

(51) Int. Cl.
G01R 31/28 (2006.01)
G01R 31/317 (2006.01)
G01R 31/3177 (2006.01)

(52) U.S. Cl.
CPC .... G01R 31/31705 (2013.01); G01R 31/3177 (2013.01)

(58) Field of Classification Search
CPC .............. G01R 31/31705; G01R 31/3177
See application file for complete search history.

(56) References Cited

U.S. PATENT DOCUMENTS

| 2004/0040013 | A1 | 2/2004 | Kalra |
| 2007/0226702 | A1* | 9/2007 | Segger ............... G06F 11/3624 717/130 |
| 2009/0300410 | A1 | 12/2009 | Yamamoto et al. |

FOREIGN PATENT DOCUMENTS

| JP | 2004-86910 | 3/2004 |
| JP | 2008-250442 | 10/2008 |
| JP | 2009-289106 | 12/2009 |

OTHER PUBLICATIONS

Walma, Mathys, "Pipelined Cyclic Redundancy Check (CRC) Calculation", *Proc. of 16th Int'l Conf. on Computer Communications and Networks*, 2007, pp. 365-370.

* cited by examiner

*Primary Examiner* — Sam Rizk
(74) *Attorney, Agent, or Firm* — Staas & Halsey LLP

(57) ABSTRACT

A circuit includes don't-care a code-value calculation circuit to calculate third code-values by coding a signal sequence in accordance with a coding scheme; a first sequence-detection circuit to detect a first sequence based on comparison of a first code-value with a difference between the current third code-value and a fourth code-value that is the third code-value preceding the current third code-value by a length of the first sequence; an expected-value calculation circuit to calculate an expected value of the third code-value at the end of the third sequence based on a second code-value and a fifth code-value that is one of the third code-values; and a determination circuit to detect the end of the second sequence based on a length of a fourth sequence, notify an expected-value calculation circuit of the detection of the second sequence, and output a detection signal indicating detection of a detection-target sequence.

6 Claims, 14 Drawing Sheets

| TIME (COUNT VALUE) | SEQUENCE Sa | SEQUENCE Sba1 | SEQUENCE Sb1 | SEQUENCE Sb2 |
|---|---|---|---|---|
| | DETECTION RESULT | DETECTION RESULT | END DETERMINATION RESULT | DETECTION RESULT (END DETERMINATION RESULT) |
| t1 | 0 | 0 | 0 | 0 |
| t2 | 1 | 0 | 0 | 0 |
| t3 | 0 | 1 | 0 | 0 |
| t4 | 1 | 0 | 0 | 0 |
| t5 | 0 | 1 | 1 | 0 |
| t6 | 0 | 0 | 0 | 0 |
| t7 | 0 | 0 | 1 | 0 |
| t8 | 0 | 0 | 0 | 1 |

DEBUG CIRCUIT, SEMICONDUCTOR DEVICE, AND DEBUG METHOD

CROSS-REFERENCE TO RELATED APPLICATION

This application is based upon and claims the benefit of priority of the prior Japanese Patent Application No. 2015-094556, filed on May 7, 2015, the entire contents of which are incorporated herein by reference.

FIELD

The embodiments discussed herein relate to a debug circuit, a semiconductor device, and a debug method.

BACKGROUND

One of actual-hardware debugging systems for checking whether or not actual hardware normally operates is a logic analyzer in which a debug circuit is inserted at mounting of a debug-target circuit, and performs debugging.

In the logic analyzer, the debug circuit monitors a signal sequence (signal transition) of the debug-target circuit designated by the user. Then, when the signal sequence matches a predetermined stop condition, the debug circuit stops operation of the circuit, and outputs the signal sequence stored in a trace memory to a display or the like.

The related techniques are disclosed in Japanese Laid-open Patent Publication Nos. 2008-250442, 2004-086910, and 2009-289106, and M. Walma, "Pipelined Cyclic Redundancy Check (CRC) Calculation", Proc. of 16th Int'l Conf. on Computer Communications and Networks, pp. 365-370, 2007.

In the case of software debugging, a program may be stopped in response to various conditions by using break points. In contrast, in the case of hardware debugging, it is difficult to stop the hardware under conditions or at timings desired by a user due to hardware constraints such as the capacity of the trace memory and the number of signal lines usable for debugging. In such a situation, improvement in working efficiency at debugging is a challenging issue.

SUMMARY

According to an aspect of the invention, a debug circuit includes a memory configured to store, among code values calculated in accordance with a coding scheme that varies code values according to a signal sequence in a debug-target circuit, a first code value obtained by coding a leading first sequence of a plurality of sequences divided from a detection-target sequence detected from the signal sequence, a second code value obtained by coding a third sequence being a designated value sequence in each of two or more second sequences of the plurality of sequences, and a length of a fourth sequence being a don't-care value sequence in each of the second sequences; a code value calculation circuit configured to calculate third code values by coding the signal sequence in accordance with the coding scheme; a first sequence detection circuit configured to detect the first sequence based on comparison of the first code value with a difference between the current third code value and a fourth code value that is the third code value preceding the current third code value by a length of the first sequence; an expected value calculation circuit configured to calculate an expected value of the third code value at the end of the third sequence based on the second code value and a fifth code value that is one of the third code values at a time when the first sequence or the second sequence is detected; and a determination circuit configured to detect the end of the second sequence based on a length of the fourth sequence when the third code value matches the expected value, notify the expected value calculation circuit of the detection of the second sequence, and output a detection signal indicating detection of the detection-target sequence when the end of all the second sequences is detected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
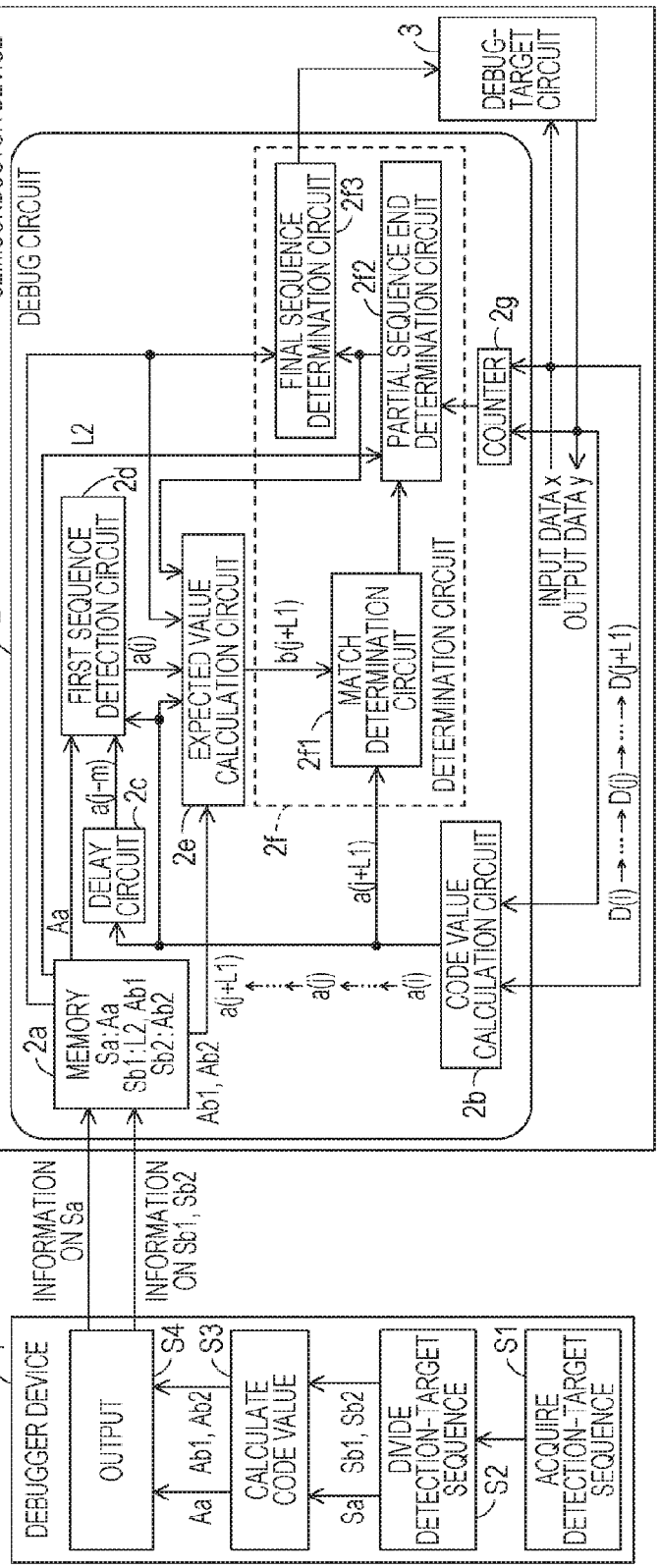
FIG. 1A is a view illustrating an example of a semiconductor device, a debug circuit, and a debugger device in First embodiment.
FIG. 1B is a view illustrating an example of a detection-target sequence S.
FIG. 1C is a view illustrating an example of updating of a code value of the detection-target sequence.

Embodiments for carrying out the disclosure will be described below with reference to figures. FIG. 1A is a view illustrating an example of a semiconductor device, debug circuit, and a debugger device in First embodiment.

A semiconductor device 1 includes a debug circuit 2 and a debug-target circuit 3. The debug-target circuit 3 is, for example, hardware that transmits and receives data, and performs calculation. The debug circuit 2 detects a predetermined signal sequence (hereinafter referred to a detection-target sequence), which serves as a stop condition of the debug-target circuit 3, from any signal sequence in the debug-target circuit 3, and outputs a detection signal indicating that the detection-target sequence is detected. The detection signal is used to stop operation of the debug-target circuit 3, for example.

The detection-target sequence may include a designated value and a don't-care value that does not affect a detection result of the detection-target sequence. Thus, the don't-care value may be any value. For example, the don't-care value is set for a value that is unknown at debugging or the like. Information on a length of a sequence including such don't-care values (hereinafter, also referred to as a don't-care value sequence) is provided from, for example, a debugger device 4.

The debug circuit 2 in this embodiment may set the signal sequence including such don't-care value as a detection target. FIG. 1B illustrates an example of a detection-target sequence S. A plurality of elliptical elements each denote the designated value or the don't-care value. In the example in FIG. 1B, the detection-target sequence S is divided into three sequences Sa, Sb1, and Sb2, and the second sequence Sb1 includes a designated value sequence having a length L1, and a don't-care value sequence having a length L2. Among the divided sequences of the detection-target sequence S, the leading sequence Sa and the tailing sequence Sb2 do not include the don't-care value. The lengths L1, L2 of the sequences are expressed as the number of bytes, for example.

The detection-target sequence S may be divided into four or more sequences. The debug circuit 2 has a memory 2a, a code value calculation circuit 2b, a delay circuit 2c, a first sequence detection circuit 2d, an expected value calculation circuit 2e, and a determination circuit 2f. The memory 2a may include a volatile storage medium and a nonvolatile storage medium. Examples of the volatile storage medium include a random access memory (RAM). The nonvolatile storage medium may include at least one of a hard disc drive (HDD), a solid state drive (SSD), an electrically erasable programmable read-only memory (EEPROM), and a flash memory. The debug circuit 2 further includes a counter 2g that counts the number of data (e.g. the number of bytes) of input data x input to the debug-target circuit 3 and output data y output from the debug-target circuit 3.

The memory 2a stores a code value Aa obtained by coding the sequence Sa, code values Ab1, Ab2 obtained by coding designated value sequences in the sequences Sb1, Sb2, and the length L2 of a don't-care value sequence. The memory 2a may further store lengths of the designated value sequences Sa, Sb1, and Sb2, and identification information of the detection-target sequence S.

The code values Aa, Ab1, and Ab2 are calculated in accordance with a coding scheme that varies the code value according to the signal sequence in the debug-target circuit 3. The code values Aa, Ab1, and Ab2 are, for example, code values (linear codes) having linearity, and are calculated by the debugger device 4 in accordance with a coding scheme such as Cyclic Redundancy Check (CRC).

The code value calculation circuit 2b calculates the code value according to the signal sequence of the debug-target circuit 3, in accordance with the same coding scheme as the coding scheme used when the debugger device 4 calculates the code values Aa, Ab1, and Ab2. For example, the code value calculation circuit 2b acquires the signal of the debug-target circuit 3 (input data x or output data y) in units of bytes, and updates the code value. In this case, the detection-target sequence S is a sequence in units of bytes.

FIG. 1C illustrates an example of the code value calculated when the input data x or the output data y as the signal of the debug-target circuit 3 transitions from a state of D(i) to states D(j) and then, D(j+L1). The state of D(i) have to not be an initial state, and may be a state in the middle of a certain sequence. i, j, and j+L1 each denote a count value of the counter 2g. Here, the length L1 of the designated value sequence in the sequence Sb1 is expressed as the number of bytes (the number of counts). When the input data x or the output data y changes in this manner, in the example in FIG. 1C, the code value is updated from a(i) to a(j) and then, a(j+L1). The count value corresponds to the number of times the code value is updated.

The delay circuit 2c outputs a code value that is calculated by the code value calculation circuit 2b at an earlier time by a period corresponding to a length of the sequence Sa in the detection-target sequence S. For example, the delay circuit 2c is a shift register, and holds each of the code values calculated by the code value calculation circuit 2b for the length of the sequence Sa, and outputs the code values one after another from the firstly input code value. That is, the delay circuit 2c functions of delaying outputting of the input code values.

Here, the length of the sequence Sa is m counts (that is, m bytes). FIG. 1A illustrates the example in which the delay circuit 2c outputs a code value a(j−m). The code value a(j−m) is a code value preceding from a code value a(j) by m counts.

The first sequence detection circuit 2d compares a difference between the code value output from the code value calculation circuit 2b and the code value output from the delay circuit 2c with the code value Aa, and detects the leading sequence Sa in the plurality of sequences divided from the detection-target sequence S based on the comparison. That is, the first sequence detection circuit 2d detects the sequence Sa based on comparison between the change in the code values of m counts and the code value Aa.

For example, when the difference between the code value output from the code value calculation circuit 2b and the code value output from the delay circuit 2c corresponds to the code value Aa, the first sequence detection circuit 2d detects that the signal of the debug-target circuit 3 transitions in the sequence Sa.

FIG. 1C illustrates a detection example in which the sequence Sa follows an unknown sequence X. In this case, since the difference between the code value a(j) output from the code value calculation circuit 2b and the code value a(j−m) output from the delay circuit 2c corresponds to the code value Aa, the sequence Sa is detected.

When detecting the sequence Sa, the first sequence detection circuit 2d supplies the code value output from the code value calculation circuit 2b at detection to the expected value calculation circuit 2e. In the example illustrated in FIG. 1A, the code value a(j) is supplied to the expected value calculation circuit 2e.

The expected value calculation circuit 2e calculates an expected value of the code value calculated by the code value calculation circuit 2b at the end of the designated value sequence in the sequence Sb1 based on the code value output at detection of the sequence Sa among the code values calculated by the code value calculation circuit 2b, and a code value Ab1. The expected value calculation circuit 2e calculates an expected value of the code value calculated by the code value calculation circuit 2b at the end of the designated value sequence in the sequence Sb2 based on the code value output at detection of the sequence Sb1 among the code values calculated by the code value calculation circuit 2b, and a code value Ab2.

For example, when the code value output at detection of the sequence Sa is the code value a(j), the expected value calculation circuit 2e calculated an expected value b(j+L1) according to an XOR of the code value a(j) and the code value Ab1. An example of an expression of calculating the expected value will be described later (refer to expression (3)).

When the code value output from the code value calculation circuit 2b matches the expected value, the determination circuit 2f detects the end of the sequences Sb1, Sb2 based on the length of the don't-care value sequence, and notifies the detection to the expected value calculation circuit 2e.

In the example in FIG. 1B, the sequence Sb1 includes the don't-care values, and the length of the don't-care value sequence is L2. When the count value becomes a sum (j+L1+L2) of L2 and a count value (j+L1) at a time when the code value output from the code value calculation circuit 2b matches the expected value b(j+L1), the determination circuit 2f determines the end of the sequence Sb1. The sequence Sb2 does not include the don't-care value and thus, the length of the don't-care value sequence is 0. Accordingly, when the count value becomes a value at a time when the code value output from the code value calculation circuit 2b matches the expected value, the determination circuit 2f determines the end of the sequence Sb2.

When detecting the end of all the sequences Sb1, Sb2, the determination circuit 2f outputs a signal indicating detection of the detection-target sequence. For example, as illustrated in FIG. 1A, the determination circuit 2f includes a match determination circuit 2f1, a partial sequence end determination circuit 2f2, and a final sequence determination circuit 2f3.

The match determination circuit 2f1 determines whether or not the expected value calculated by the expected value calculation circuit 2e matches the code value calculated by the code value calculation circuit 2b. The partial sequence end determination circuit 2f2 acquires the length of the don't-care value sequence from the memory 2a, and determines whether or not the sequences Sb1, Sb2 end based on the length. For example, when the count value in the counter 2g increases from the count value at a time when the match determination circuit 2f1 detects matching between the code value and the expected value, by a count number corresponding to the length of the don't-care value sequence, the partial sequence end determination circuit 2f2 determines that the sequences Sb1, Sb2 end. In the above-mentioned example, when the count value is (j+L1+L2), the end of the sequence Sb1 is determined.

When determining the end of the sequences Sb1, Sb2, the partial sequence end determination circuit 2f2 notifies the expected value calculation circuit 2e and the final sequence determination circuit 2f3 of the detection of the sequences Sb1, Sb2.

The final sequence determination circuit 2f3 detects the number of sequences divided from the detection-target sequence S, from information stored in the memory 2a. The number of divided sequences itself may be stored in the memory 2a, and in this case, the final sequence determination circuit 2f3 may acquire the number of sequences thus stored. Then, based on the number of sequences, the final sequence determination circuit 2f3 determines whether or not the end of all the sequences Sb1, Sb2 is notified by the partial sequence end determination circuit 2f2. When determining that the end of all the sequences Sb1, Sb2 is notified, the final sequence determination circuit 2f3 outputs a signal indicating detection of the detection-target sequence. This signal serves as a circuit stop signal that instructs stop of operation of the debug-target circuit 3.

The final sequence determination circuit 2f3 stops supply of a clock signal to the debug-target circuit 3 in response to the circuit stop signal, thereby stopping operation of the debug-target circuit 3. The final sequence determination circuit 2f3 may block inputting of data to the debug-target circuit 3 or outputting data from the debug-target circuit 3 to stop the debug-target circuit 3.

The debugger device 4 illustrated in FIG. 1A communicates with the semiconductor device 1 to perform debugging. The debugger device 4 is, for example, a computer, and executes following processing using software. The debugger device 4 first acquires the detection-target sequence S from a user (debug operator) (Step S1). Next, the debugger device 4 divides the detection-target sequence S into the sequences Sa, Sb1, and Sb2 as illustrated in FIG. 1B (Step S2). The debugger device 4 calculates the code values Aa, Ab1, and Ab2 obtained by coding the designated value sequences in the sequences Sa, Sb1, and Sb2, respectively (Step S3). Then, the debugger device 4 outputs (transmits) information on the sequences Sa, Sb1, and Sb2, which includes the calculated code values Aa, Ab1, and Ab2 and the length L2 of the don't-care value sequence, to the semiconductor device 1 (Step S4).

Hereafter, description is provided for an example of a debug method using a debug system including the semiconductor device 1 and the debugger device 4. The information of the sequences Sa, Sb1, and Sb2, which is calculated and transmitted by the debugger device 4 in the processing in Step S1 to S4 is stored in the memory 2a in the debug circuit 2 of the semiconductor device 1.

The debug circuit 2 detects transition of the signal of the debug-target circuit 3, and in the example illustrate in FIG. 1A, the code value calculation circuit 2b updates the code value based on the sequence of the input data x or the output data y.

For example, when the input data x or the output data y transitions from the state D(i) to D(i), D(j), and D(j+L1) as illustrated in FIG. 1C, the output of the code value calculation circuit 2b is updated from the code value a(i) to a(j), and a(j+L1).

When the code value a(j) is output from the code value calculation circuit 2b, a difference between the code value a(j) and code value a(j−m) output from the delay circuit 2c corresponds to the code value Aa, the first sequence detection circuit 2d supplies the code value a(j) to the expected value calculation circuit 2e. The expected value calculation circuit 2e calculates the expected value b(j+L1) based on the code value a(j) and the code value Ab1.

When the match determination circuit 2f1 detects matching between the code value output from the code value calculation circuit 2b a(j+L1) and the expected value b(j+L1), the partial sequence end determination circuit 2f2 detects the end of the sequence Sb1 when the count value is (j+L1+L2).

Then, the expected value calculation circuit 2e calculates the expected value at the end of the sequence Sb2 in the same manner based on the code value a(j+L1+L2) and the code value Ab2. When the match determination circuit 2f1 detects matching between the expected value and the code value output from the code value calculation circuit 2b, since the length of the don't-care value sequence in the sequence Sb2 is 0, the partial sequence end determination circuit 2f2 detects the end of the sequence Sb2. When the end of the sequence Sb2 is detected, the final sequence determination circuit 2f3 outputs a signal indicating detection of the detection-target sequence S. This signal stops operation of the debug-target circuit 3.

After that, for example, the debugger device 4 performs debugging including check of the signal state of each unit of the debug-target circuit 3. As described above, the debug circuit 2 in this embodiment detects the sequence Sb1 including the don't-care values based on the code value Ab1 for the designated values and the length L2 of the don't-care value sequence, without considering the code value for the don't-care values calculated by the code value calculation circuit 2b. Thereby, even the signal sequence including the don't-care values may be set as a detection target, increasing the degree of freedom in setting the detection-target sequence. For this reason, the working efficiency at debugging is improved.

With limitation in terms of hardware, the debug-target circuit 3 may be readily stopped under various conditions by adopting the above-mentioned code value, improving the working efficiency at debugging. Because the debug circuit 2 executes processing using a code value having a small amount of data, in place of directly handing input data x or output data y, the processing may be executed by a small-size circuit at higher speed.

Further, even when a complicated sequence is the detection-target sequence, since the sequence may be expressed as code values, the capacity of the memory 2a may be decreased to reduce circuit areas of the debug circuit 2 and the semiconductor device 1.

At change of a detection-target sequence, the memory 2a only has to store the code value obtained by coding the detection-target sequence. Hence, reinstallation of the circuit is not desirable, improving the working efficiency at debugging.

Figure 2:
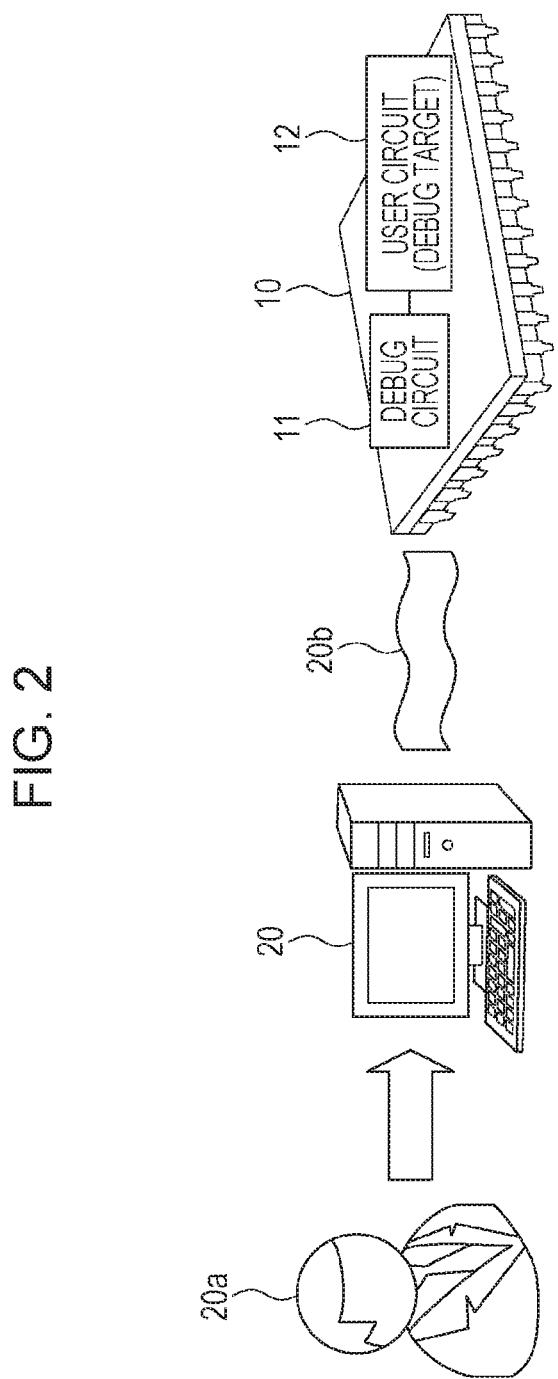
FIG. 2 is a view illustrating an example of a debug system including a semiconductor device and a debugger device in Second embodiment.

FIG. 2 is a view illustrating an example of a debug system including a semiconductor device and a debugger device in Second embodiment.

The debug system includes a semiconductor device 10 and a debugger device 20, and the semiconductor device 10 is connected to the debugger device 20 via a communication cable 20b. The semiconductor device 10 may wirelessly communicate with the debugger device 20.

The semiconductor device 10 is, for example, a system on chip (SoC), and includes a debug circuit 11 and a user circuit 12 to be debugged. The debugger device 20 is, for example, a computer, and is operated by an operator 20a and communicates with the semiconductor device 10 via the communication cable 20b to perform debugging.

Figure 3:
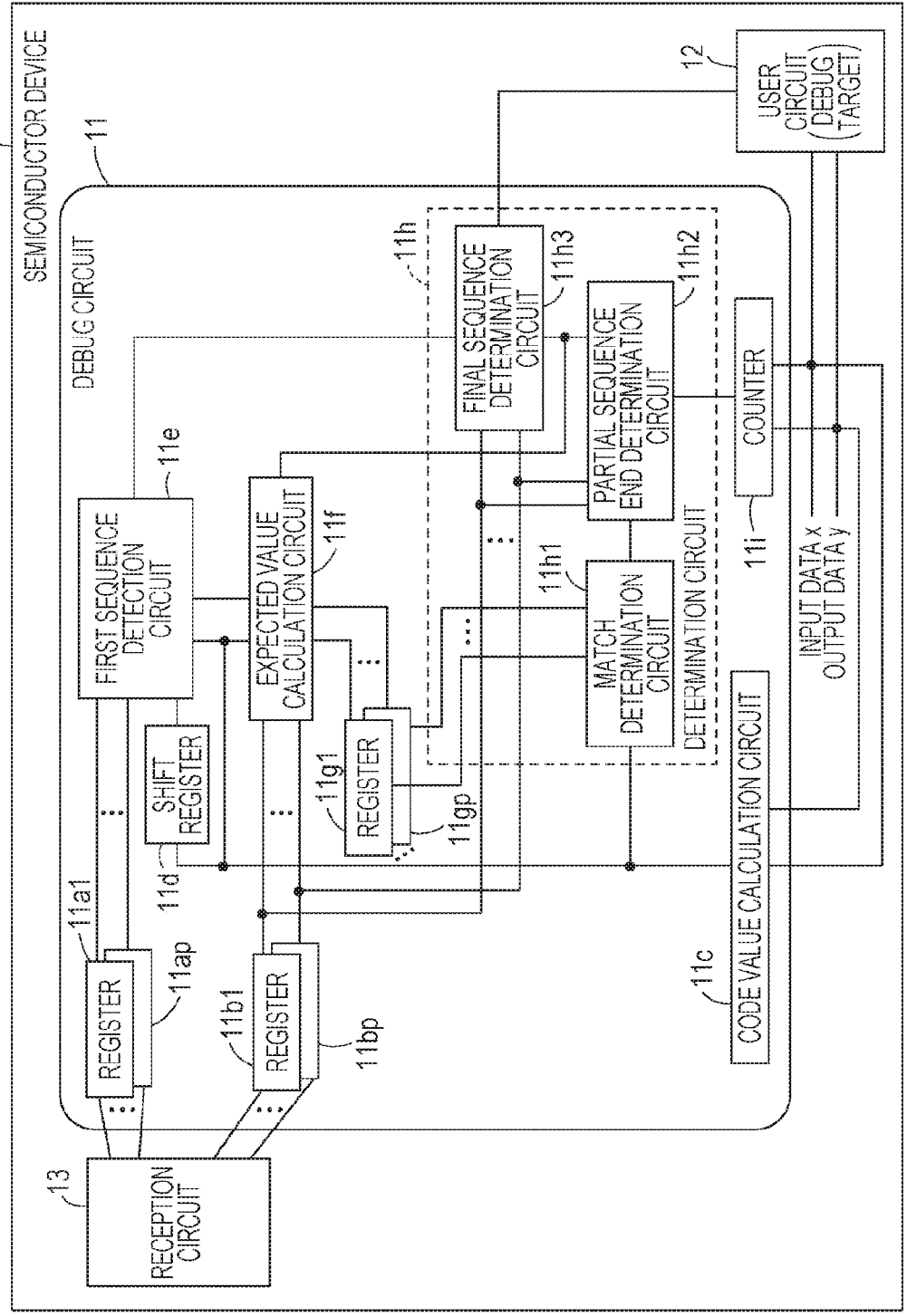
FIG. 3 is a view illustrating an example of the semiconductor device.

FIG. 3 is a view illustrating an example of a semiconductor device. The semiconductor device 10 includes a reception circuit 13 that receives data transmitted from the debugger device 20 via the communication cable 20b, in addition to the debug circuit 11 and the user circuit 12.

The debug circuit 11 includes registers 11a1 to 11ap, registers 11b1 to 11bp, a code value calculation circuit 11c, a shift register 11d, a first sequence detection circuit 11e, an expected value calculation circuit 11f, registers 11g1 to 11gp, a determination circuit 11h, and a counter 11i.

The registers 11a1 to 11ap and the registers 11b1 to 11bp have a function of the memory 2a in the debug circuit 2 in First embodiment. In place of the registers 11a1 to 11ap and the registers 11b1 to 11bp, a random access memory (RAM) may be used.

The registers 11a1 to 11ap stores information on the code value obtained by coding the leading sequence having no don't-care value among the divided sequences in each of a plurality of (p) detection-target sequences. Hereinafter, as in First embodiment, a certain detection-target sequence, and a leading sequence among sequences divided from the detection-target sequence are denoted by the detection-target sequence S and the sequence Sa, respectively.

The registers 11b1 to 11bp stores code values obtained by coding remaining sequences among the divided plurality of sequences, and information such as the length of the don't-care value sequence. Hereinafter, the number of the remaining sequences is denoted by n−1, and the remaining sequences are expressed as sequences Sb1 to Sbn−1. Then, n denotes the number of divided sequences, and n is 1 or more (where n=1 indicates no division). Hereinafter, the code value is coded by CRC, but the code value is not limited to this, and may be a code value having linearity.

Figure 4:
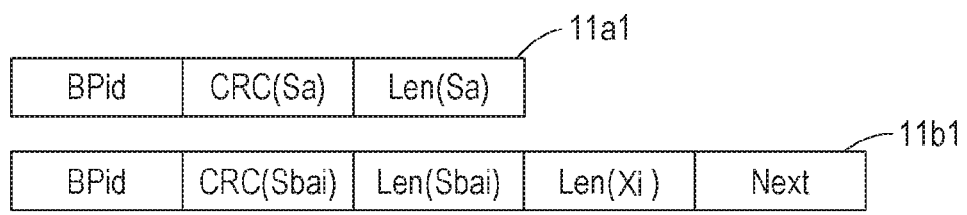
FIG. 4 is a view illustrating an example of storage of information in registers.

FIG. 4 is a view illustrating an example of storage of information in registers. The register 11a1 stores identification information BPid of the detection-target sequence S including the sequence Sa, a code value CRC(Sa) of the sequence Sa, and a length Len(Sa) of the sequence Sa.

The register 11b1 stores information on the sequences Sb1 to Sbn−1 of the detection-target sequence. FIG. 4 illustrates an example of storage of information on the $i^{th}$ sequence Sbi among the sequences Sb1 to Sbn−1. The register 11b1 stores identification information BPid of the detection-target sequence S including the sequence Sbi, a code value CRC (Sbai) of a designated value sequence Sbai included in the sequence Sbim and a length Len(Sbai) of the sequence Sbai. The register 11b1 further stores a length Len(Xi) of the don't-care value sequence Xi included in the sequence Sbi, and a pointer Next designating a storage location of information on $i+1^{th}$ sequence Sbi+1.

The identification information BPid is used to indicate that the sequence Sa and the sequence Sbai are included in the same detection-target sequence. In a below-mentioned example, the lengths Len(Sa), Len(Sbai), and Len(Xi) are expressed as the number of bytes. When the counter 11i counts up at a cycle of one clock, and the code value calculation circuit 11c calculates the code value at the clock cycle, the above length information is expressed in units of clock cycle.

The pointer Next included information on a n−1th sequence Sbn−1 has a value indicating the final sequence (for example, "Null"). The detection-target sequence designates the transition mode of a signal on the user circuit 12 to stop the user circuit 12. The signal on the user circuit 12 is input data or output data of the user circuit 12, or an internal signal. Although the detection-target sequence will be hereinafter described as transition of one signal (for example, input data or output data), the sequence may be transition of a combination of a plurality of signals.

Based on the signal sequence on the user circuit 12, the code value calculation circuit 11c calculates the code value changed by the sequence according to the same coding scheme (that is, CRC) as the coding scheme used to calculate the code values in the debugger device 20.

The shift register 11d has the same function as the delay circuit 2c in the debug circuit 2 in First embodiment. The shift register 11d holds the code values calculated by the code value calculation circuit 11c within a time corresponding to the length of the sequence Sa, and outputs them one after another from the firstly input code value. As in First embodiment, the length of the sequence Sa is set to m counts. For example, m is determined based on the capacity of the shift register 11d.

The first sequence detection circuit 11e detects the sequence Sa based on comparison of the difference between the code value output from the code value calculation circuit 11c and the code value output from the shift register 11d, with the code value stored in the registers 11a1 to 11ap.

When detecting the sequence Sa, the first sequence detection circuit 11e supplies the code value at detection to the expected value calculation circuit 11f. Further, when detecting the sequence Sa, the first sequence detection circuit 11e sends a signal indicating the detection signal (for example, "1") to a final sequence determination circuit 11h3.

The expected value calculation circuit 11f calculates the expected value of the code value calculated by the code value calculation circuit 11c at the end of the sequences Sba1 to Sban−1, based on the code value output at detection of the sequence Sa and the code values stored in the registers 11b1 to 11bp. The sequences Sba1 to Sban−1 are designated value sequences included in the sequences Sb1 to Sbn−1.

Figure 5:
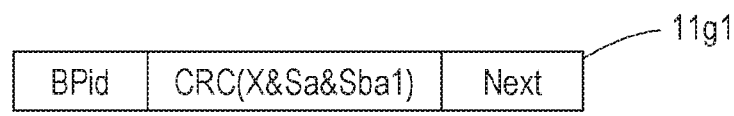
FIG. 5 is a view illustrating an example of storage of information in a register.

The registers 11g1 to 11gp stores expected values corresponding to p detection-target sequences, which are calculated by the expected value calculation circuit 11f. FIG. 5 is a view illustrating an example of storage of the expected value in the register.

The register 11g1 stores the expected value of the code value at the end of each of the designated value sequences Sba1 to Sban−1 in the sequences Sb1 to Sbn−1, the expected value calculated by the code value calculation circuit 11c. In the example illustrated in FIG. 5, an expected value CRC (X&Sa&Sba1) at the end of the sequence Sba1, the identification information BPid of the detection-target sequence S, and the pointer Next indicating the storage location of information on the next sequence Sba2 are stored. Here, "&" indicates connection of sequences. X is an unknown sequence, and the expected value CRC(X&Sa&Sba1) denotes the expected value of the code value acquired when the unknown sequence X is followed by the sequence Sa and the sequence Sba1.

The determination circuit 11h illustrated in FIG. 3 includes a match determination circuit 11h1, a partial sequence end determination circuit 11h2, and a final sequence determination circuit 11h3. The match determination circuit 11h1 determines whether or not the expected values stored in the registers 11g1 to 11gp match the code value calculated by the code value calculation circuit 11c.

The partial sequence end determination circuit 11h2 acquires the length of the don't-care value sequence from the registers 11b1 to 11bp, and determines whether or not the sequences Sb1 to Sbn−1 end based on the length. Every time the partial sequence end determination circuit 11h2 determines the end of any of the sequences Sb1 to Sbn−1, the partial sequence end determination circuit 11h2 notifies the expected value calculation circuit 11f and the final sequence determination circuit 11h3 of detection of the sequence Sb1 to Sbn−1.

The final sequence determination circuit 11h3 detects the number of sequences divided from the detection-target sequence S, from information stored in the registers 11b1 to 11bp. The number of sequences itself may be stored in the registers 11b1 to 11bp or the registers 11a1 to hap, and in this case, the final sequence determination circuit 11h3 acquires the number of sequences.

Then, based on the number of sequences, the final sequence determination circuit 11h3 determines whether or not the partial sequence end determination circuit 11h2 notifies the end of all the sequences Sb1 to Sbn−1. When determining that the end of all the sequences Sb1 to Sbn−1 is notified, the final sequence determination circuit 11h3 outputs a signal indicating detection of the detection-target sequence S. This signal serves as a circuit stop signal that instructs stop of operation of the for example, debug-target circuit 3. When receiving notification of the end of the sequence Sbn−1, the final sequence determination circuit 11h3 may refer to the pointer Next ("NULL") included in the information on the sequence Sbn−1 to determine the end of all the sequences Sb1 to Sbn−1.

Figure 6:
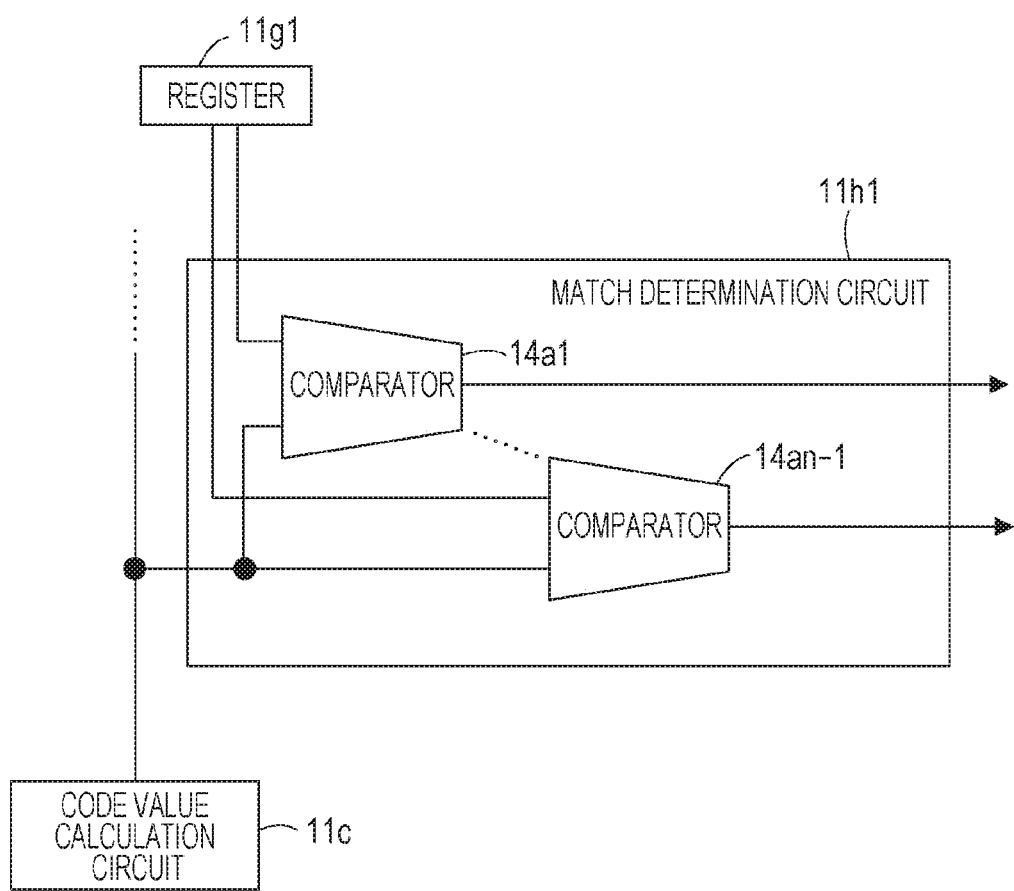
FIG. 6 is a view illustrating an example of a match determination circuit.

The match determination circuit 11h1, the partial sequence end determination circuit 11h2, and the final sequence determination circuit 11h3 in the determination circuit 11h are embodied as follows. FIG. 6 is a view illustrating an example of the match determination circuit.

The match determination circuit 11h1 includes n−1 comparators 14a1 to 14an−1. The comparators 14a1 to 14an−1 determines whether or not n−1 expected values of the detection-target sequence S, which are stored in the register 11g1, with the code value calculated by the code value calculation circuit 11c. For example, the comparator 14a1 compares the expected value CRC(X&Sa&Sba1) at the end of the sequence Sba1 with the code value calculated by the code value calculation circuit 11c, and outputs "1" when they match each other.

The n−1 expected values of other detection-target sequences stored in the registers 11g1 to 11gp except for the register 11g1 may be also used in the above circuit for matching determination. In this case, a selection circuit for selecting an output of any of the registers 11g1 to 11gp is provided.

Figure 7:
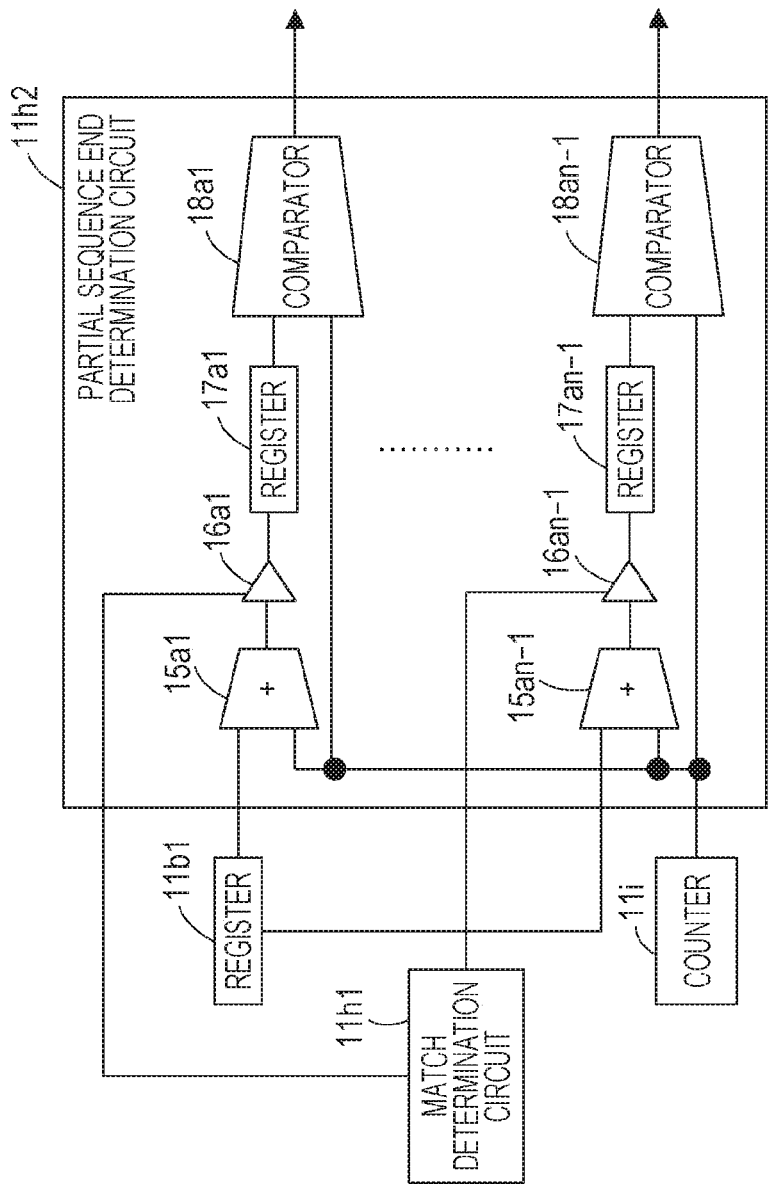
FIG. 7 is a view illustrating an example of a partial sequence end determination circuit.

FIG. 7 is a view illustrating an example of the partial sequence end determination circuit. The partial sequence end determination circuit 11h2 includes n−1 adder circuits 15a1 to 15an−1, n−1 buffers 16a1 to 16an−1, n−1 registers 17a1 to 17an−1, and n−1 comparators 18a1 to 18an−1.

The adder circuits 15a1 to 15an−1 add the lengths of the don't-care value sequences X1 to Xn−1 included in the sequences Sb1 to Sbn−1, which are stored in the register 11b1, to the count value of the counter 11i.

The buffers 16a1 to 16an−1 receive the respective addition results of the adder circuits 15a1 to 15an−1, and each output the addition result when receiving, from the match determination circuit 11h1, a signal indicating matching between the expected value and the code value for the corresponding one of the sequences Sb1 to Sbn−1. The addition result at this time corresponds to the count value at the end of the corresponding sequence Sb1 to Sbn−1.

The registers 17a1 to 17an−1 store the addition results. The comparators 18a1 to 18an−1 determines whether or not the respective added values stored in the registers 17a1 to 17an−1 match the count value of the counter 11i. For example, the comparator 18a1 compares the added value stored in the register 17a1, which corresponds to the count value at the end of the sequence Sb1, with the current count value of the counter 11i, and outputs "1" when they match each other.

Lengths of the don't-care value sequence in other detection-target sequences, which are stored in the registers 11b1 to 11bp except for the register 11b1, may be used in the above circuit for determination. In this case, selection circuit for selecting an output of any of registers 11b1 to 11bp is provided.

Figure 8:
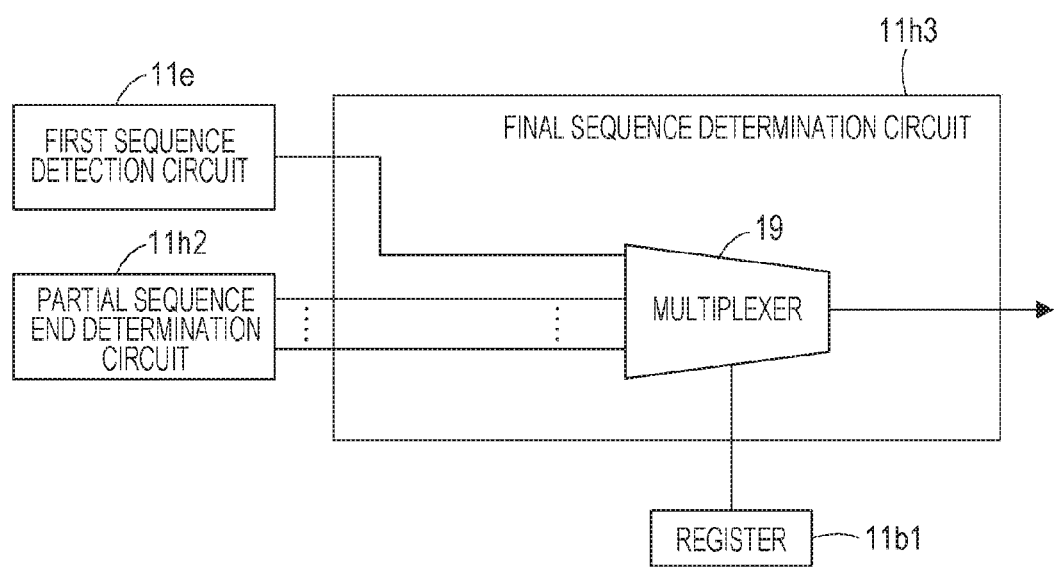
FIG. 8 is a view illustrating an example of a final sequence determination circuit.

FIG. 8 is a view illustrating an example of a final sequence determination circuit. The final sequence determination circuit 11h3 includes a multiplexer 19. The multiplexer 19 receives a 1-bit signal indicating whether or not the sequence Sa output from the first sequence detection circuit 11e is detected. The multiplexer 19 further receives an n−1 bit signal indicating whether or not the sequences Sb1 to Sbn−1 output from the partial sequence end determination circuit 11h2 end. Then, the multiplexer 19 outputs a signal indicating whether or not the final sequence ends, based on the number of sequences (=n) divided from the detection-target sequence S, which is stored in, for example, the register 11b1.

For example, in the case of n=1, when receiving the signal indicating detection of the sequence Sa from the first sequence detection circuit 11e, the multiplexer 19 outputs a signal indicating the end of the final sequence, that is the signal indicating detection of the detection-target sequence.

For example, in the case of n=3, when receiving a signal indicating the end of the sequence Sb2 from the partial sequence end determination circuit 11h2, the multiplexer 19 outputs a signal indicating the end of the final sequence, that is, a signal indicating detection of the detection-target sequence.

Examples of processing of the first sequence detection circuit 11e, the expected value calculation circuit 11f, and the determination circuit 11h will be described later.

Figure 9:
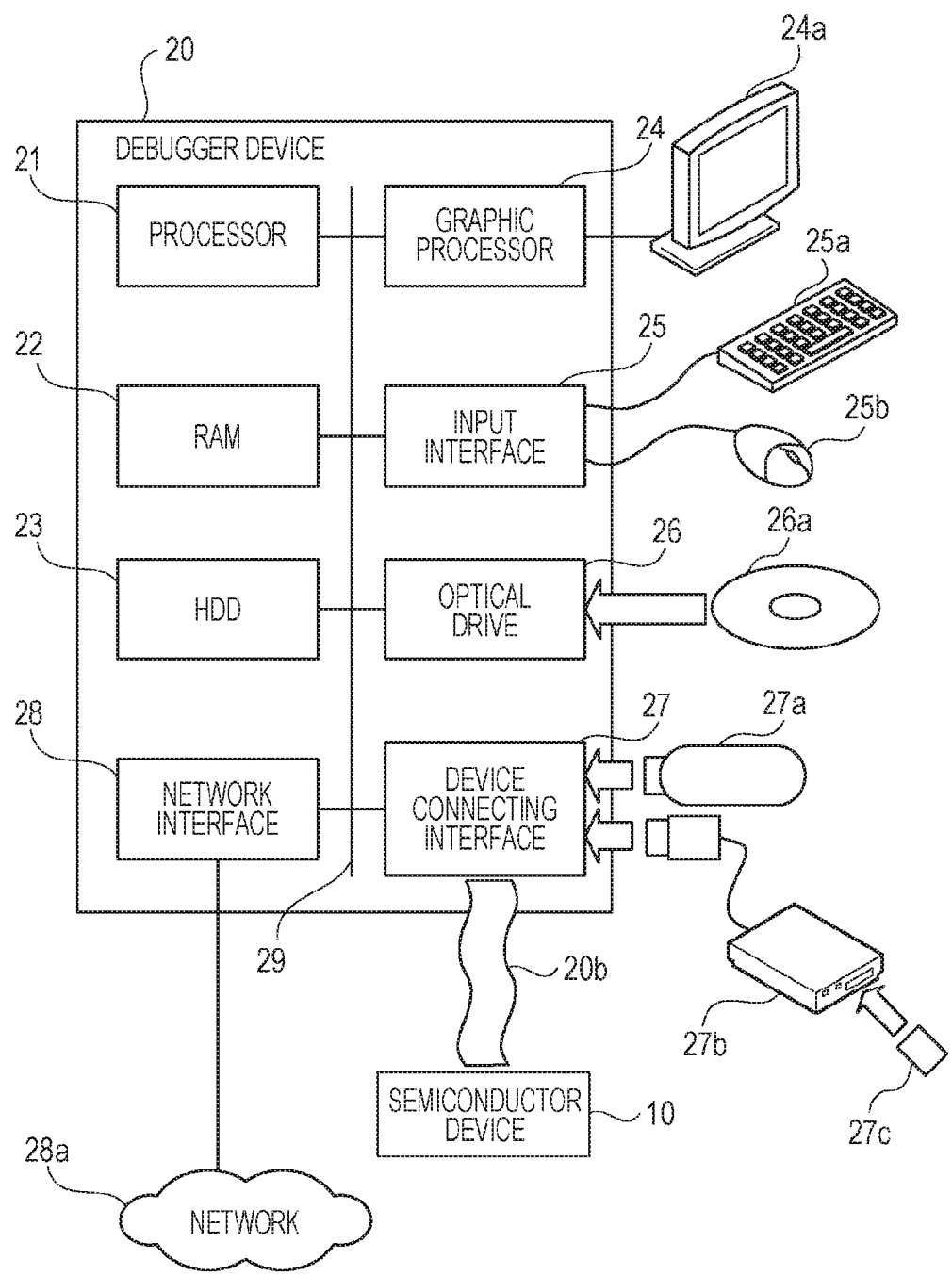
FIG. 9 is a view illustrating an example of hardware of a debugger device.

FIG. 9 is a view illustrating an example of hardware of the debugger device.

The debugger device 20 is a computer, and is controlled by a processor 21 as a whole. A RAM 22 and a plurality of peripheral devices are connected to the processor 21 via a bus 29. The processor 21 may be a multiprocessor. Examples of the processor 21 includes a central processing unit (CPU), a micro processing unit (MPU), a digital signal processor (DSP), an application specific integrated circuit (ASIC), and a programmable logic device (PLD). The processor 21 may be any combination of two or more of CPUs, MPUs, DSPs, ASICs, and PLDs.

The RAM 22 is used as a main memory of the debugger device 20. The RAM 22 temporarily stores at least a part of an OS (Operating System) program and an application program that are executed by the processor 21. The RAM 22 stores various data desirable for processing of the processor 21.

The peripheral devices connected to the bus 29 are a hard disk drive (HDD) 23, a graphic processor 24, an input interface 25, an optical drive 26, a device connecting interface 27, and a network interface 28.

The HDD 23 magnetically writes and reads data into and from an internal disc. The HDD 23 is used as an auxiliary memory of the debugger device 20. The HDD 23 stores an OS program, an application program, and various data. A semiconductor memory such as a flash memory may be used as an auxiliary memory.

A graphic processor 24 is connected to a monitor 24a. The graphic processor 24 displays an image such as a debug result on a screen of the monitor 24a according to an instruction of the processor 21. Examples of the monitor 24a include a display using cathode ray tube (CRT) and a liquid crystal display.

The input interface 25 is connected to a key board 25a and a mouse 25b. The input interface 25 transmits a signal from the key board 25a or the mouse 25b to the processor 21. The mouse 25b is an example of a pointing device, and another pointing device may be used. Examples of another pointing device include a touch panel, a tablet, a touch pad, and a track ball.

The optical drive 26 reads data recorded in an optical disc 26a using laser light or the like. The optical disc 26a is a portable recording medium in which data may be read by light reflection. Examples of the optical disc 26a include a digital versatile disc (DVD), a DVD-RAM, a compact disc read only memory (CD-ROM), and a CD-R (Recordable)/RW (ReWritable).

The device connecting interface 27 is a communication interface for connecting the peripheral devices to the debugger device 20. For example, a memory 27a and a memory reader-writer 27b may be connected to the device connecting interface 27. The memory 27a is a recording medium having a function of communicating with the device connecting interface 27. The memory reader-writer 27b writes data to a memory card 27c, and reads data from the memory card 27c. The memory card 27c is a card-type recording medium.

The device connecting interface 27 is connected to the semiconductor device 10 via the communication cable 20b. The network interface 28 is connected to a network 28a. The network interface 28 transmits and receives data to and from another computer or communication equipment via the network 28a.

The hardware thus configured may execute processing of the debugger device 20 in Second embodiment. The debugger device 4 in First embodiment may be embodied by the same hardware as the debugger device 20 illustrated in FIG. 9.

The debugger device 20 executes the program recorded in a computer-readable recording medium, thereby performing the processing in Second embodiment. The program that describes contents of the processing executed by the debugger device 20 may be recorded in various recording media. For example, the HDD 23 may store the program executed by the debugger device 20. The processor 21 loads at least a part of the program in the HDD 23 into the RAM 22 to execute the program. The program executed by the debugger device 20 may be also recorded in portable recording media such as the optical disc 26a, the memory 27a, and the memory card 27c. The program stored in the portable recording media is installed to the HDD 23 under control of the processor 21 to become available. The processor 21 may read the program directly from the portable recording media, and executes the program.

An example of a debug method using the semiconductor device 10 and the debugger device 20 will be described below.

Figure 10:
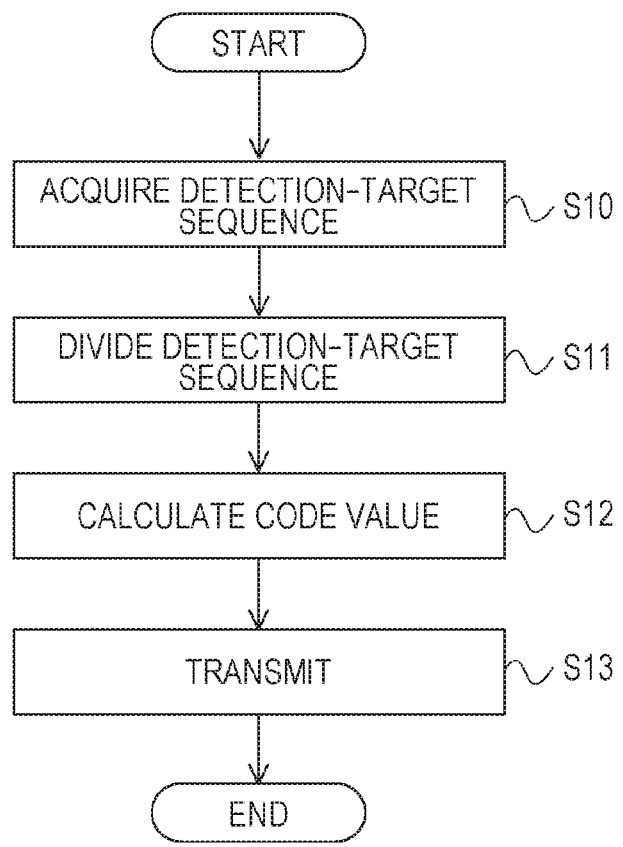
FIG. 10 is a flow chart illustrating an example of setting processing of the debugger device.

FIG. 10 is a flow chart illustrating an example of setting processing of the debugger device. The debugger device 20, for example, acquires one or more detection-target sequences input by operation of the key board 25a or the mouse 25b by the operator 20a (Step S10).

The detection-target sequence may include the don't-care value in addition to the designated value. For example, when the user circuit 12 processes a transmission control protocol (TCP) packet, a sequence number has a random initial value and thus, is set to the don't-care value.

After acquiring the detection-target sequence, the debugger device 20 divides the detection-target sequence into the leading sequence Sa including no don't-care value and remaining sequences Sb1 to Sbn−1 that may include the don't-care value (Step S11).

Then, the debugger device 20 calculates code values obtained by coding the sequence Sa and the designated value sequences Sba1 to Sban−1 in the sequences Sb1 to Sbn−1 according to CRC (Step S12). In the processing in Step S12, the debugger device 20 calculates the code value from the first signal (for example, one byte of input data or output data) of the sequence Sa, and sequentially updates the code value according to subsequent signals. When the code value is updated according to the last signal of the sequence Sa, the code value at this time becomes the code value of the sequence Sa. The sequences Sba1 to Sban-1 are similarly processed to calculate the code value.

The debugger device 20 transmits information as illustrated in FIG. 4, including the code value calculated in the processing in Step S12, to the semiconductor device 10 (Step S13). Thereby, the debugger device 20 finishes setting processing.

Figure 11:
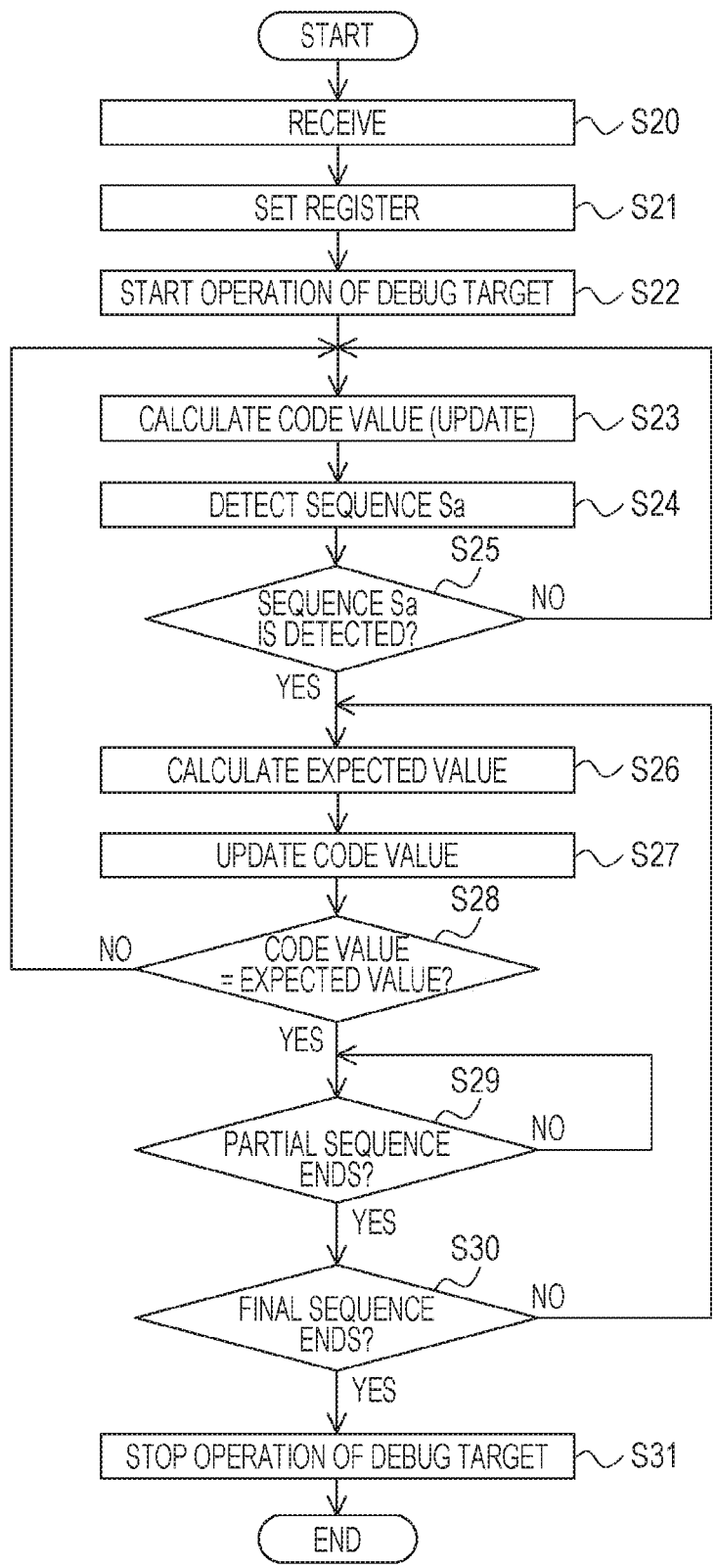
FIG. 11 is a flow chart illustrating an example of processing of the semiconductor device.

FIG. 11 is a flow chart illustrating an example of processing of the semiconductor device. The semiconductor device 10 receives the information such as the code value transmitted from the debugger device 20 by the reception circuit 13 (Step S20). Then, a control circuit not illustrated in the semiconductor device 10 sets (stores) the received information in the registers 11a1 to 11ap, 11b1 to 11bp as illustrated in FIG. 4 (Step S21).

After that, a control circuit not illustrated in the semiconductor device 10 causes the user circuit 12 to be debugged to start operation (Step S22). After start of operation of the user circuit 12, the code value calculation circuit 11c of the debug circuit 11 acquires the input data x or the output data y of the user circuit 12 in units of bytes, and calculates (updates) the code value according to CRC (Step S23).

Figure 12:
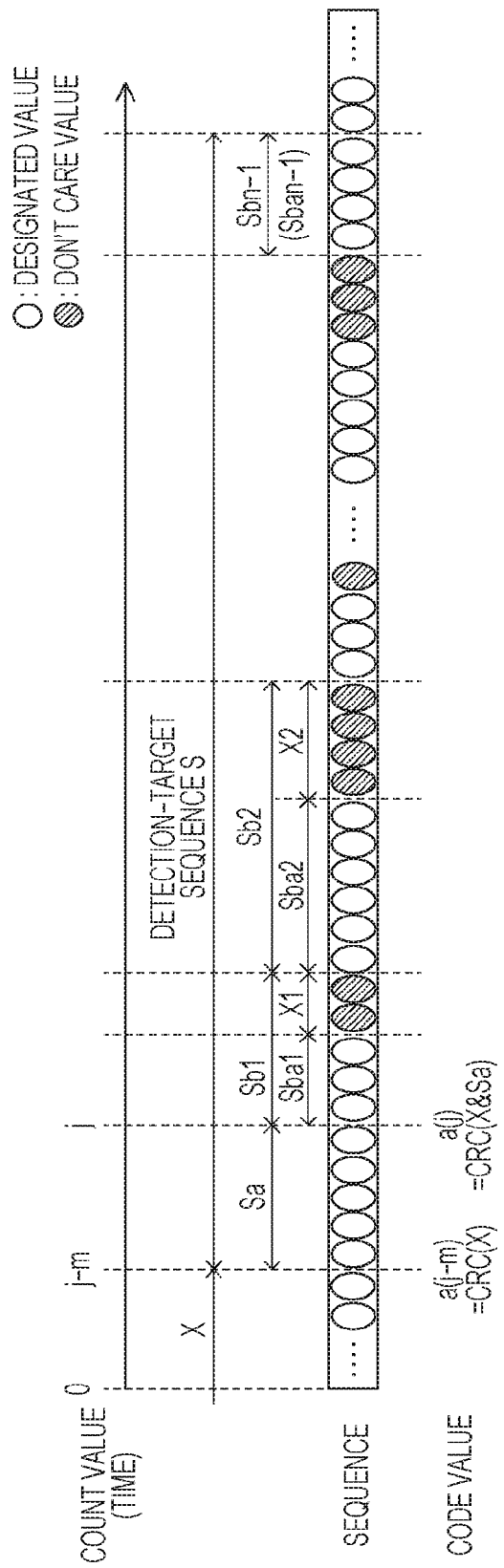
FIG. 12 is a view illustrating an example of detection of a sequence Sa.

Then, first sequence detection circuit 11e reads information recorded in the registers 11a1 to 11ap to detect the sequence Sa (Step S24). FIG. 12 is a view illustrating an example of detection of the sequence Sa.

FIG. 12 illustrates an example of a sequence starting from a count value (corresponding to time)=0. A sequence X is followed by the detection-target sequence S. FIG. 12 illustrates the example of the code values calculated by the code value calculation circuit 11c. The code value finally calculated in the sequence X is CRC(X), and the code value finally calculated in the sequence Sa is CRC(X&Sa).

The linearity of CRC satisfies a following expression.
$CRC(X\&Sa)=CRC((X\&0^m)+(0^k\&Sa))=CRC(X\&0^m)+CRC(0^k\&Sa)=CRC(X\&0^m)+CRC(Sa)=H(m)\times CRC(X)+CRC(Sa)$ ... (1)

In the expression (1), "+" denotes XOR (this applies to following expressions on CRC). "$0^m$" denotes the sequence in which the signal of the user circuit 12 continues to 0 for m counts. Given that the length of the sequence X is k counts (k bytes), "$0^k$" means the sequence in which the signal of the user circuit 12 continues to 0 for k counts.

$CRC(X\&0^m)+CRC(0^k\&Sa)=CRC(X\&0^m)+CRC(Sa)$ in the expression (1) is due to that 0 continuing from the initial state does not affect the value of the CRC irrespective of the number of 0.

In the expression (1), H(m) is a regular matrix that converts the value of CRC so as to achieve the same effect as $\&0^m$. An example of CRC calculation using the regular matrix H is described in the non-patent document 1, for example.

It is given that the count value is j, and the code value calculated by the code value calculation circuit 11c is a(j). When the count value is j, the shift register 11d outputs the code value a(j−m) preceding the code value a(j) by m counts.

When receiving the code values a(j), a(j−m), the first sequence detection circuit 11e evaluates whether or not a following conditional expression based on a difference between code values a(j) and a(j−m) holds. $a(j)-H(m)\times a(j-m)=CRC(Sa)$ ... (2) Even if the sequence X starting from the count value of 0 is unknown, the conditional expression (2) holds when the sequence from the count value j−m+1 to j matches the sequence Sa.

The first sequence detection circuit 11e determines whether or not the sequence Sa is detected by determining whether or not the expression (2) based on such CRC difference (change in the code value coded by CRC) (Step S25).

When the expression (2) holds, as illustrated in FIG. 12, the code value a(j−m) becomes a(j−m)=CRC(X), the code value a(j) becomes a(j)=CRC(X&Sa), and when the count value is j, the final signal in the sequence Sa is detected. Consequently, when the expression (2) holds, the first sequence detection circuit 11e determines that the sequence Sa is detected, and transmits the code value a(j) to the expected value calculation circuit 11f.

When the sequence Sa is not detected, that is, when the expression (2) does not hold, the processing in Step S23 and subsequent steps is repeated. When receiving the code value a(j), the expected value calculation circuit 11f calculates the expected value (Step S26).

Figure 13:
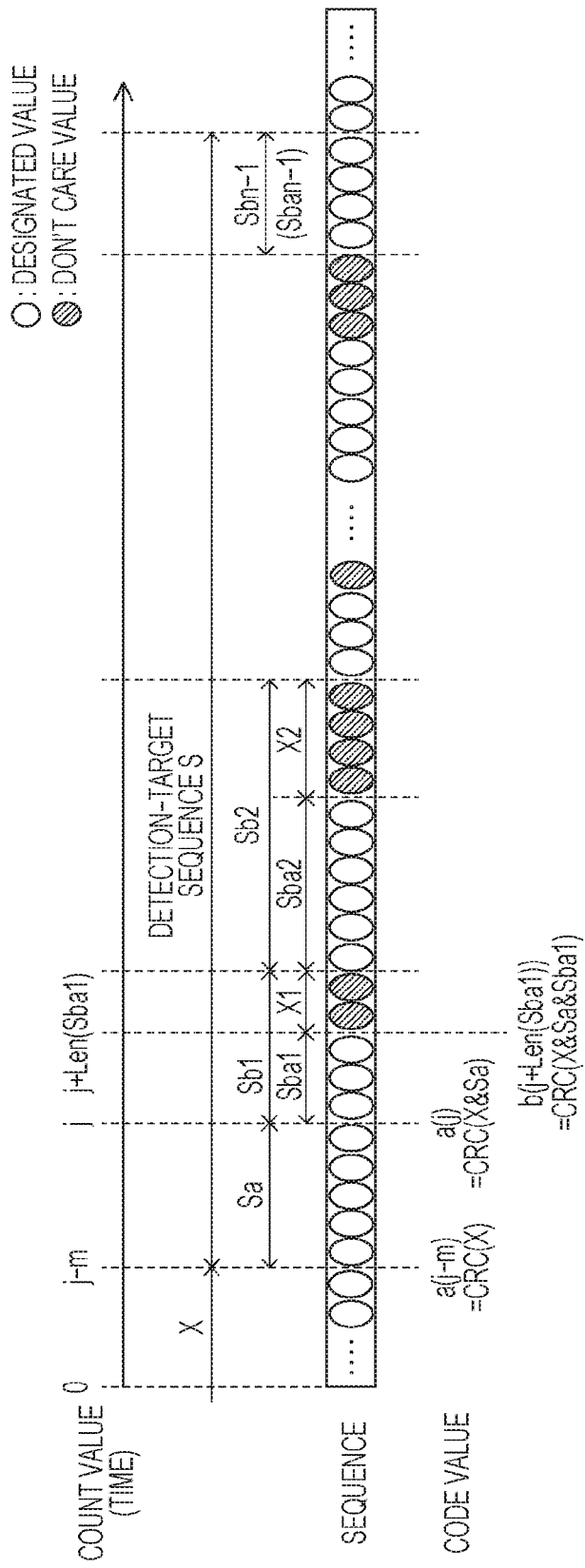
FIG. 13 is a view illustrating an example of calculation of an expected value.

FIG. 13 is a view illustrating an example of calculation of the expected value. As described above, the code value output at detection of the sequence Sa is a(j)=CRC(X&Sa). When the sequence Sb1 occurs following the sequence Sa, if the count value is j+Len(Sba1), CRC(X&Sa&Sba1) that is the expected value of the code value b(j+Len(Sba1)) is expressed by a following expression.
$CRC(X\&Sa\&Sba1)=CRC(X\&Sa\&0^{Len(Sba1)})+CRC(Sba1)=H(Len(Sba1))\times CRC(X\&Sa)+CRC(Sba1)$ (3) CRC(Sba1) is the code value of the sequence Sba1, and is stored in any of the registers 11b1 to 11bp.

Accordingly, the expected value calculation circuit 11f reads the code value of the sequence Sba1 having the same identification information BPid as the sequence Sa from any of the registers 11b1 to 11bp, and calculates the expected value by the expression (3).

Then, the code value calculation circuit 11c updates the code value (Step S27), and the match determination circuit 11h1 determines whether or not the code value output from the code value calculation circuit 2b matches the expected value (Step S28). When the match determination circuit 11h1 determines that the code value output from the code value calculation circuit 2b does not match the expected value, the processing in Step S23 and subsequent steps is repeated. When the code value matches the expected value, the match determination circuit 11h1 outputs a signal indicating the matching.

When receiving the signal, the partial sequence end determination circuit 11h2 acquires the length of the don't-care value sequence from the registers 11b1 to 11bp. Then, based on the length, the partial sequence end determination circuit 11h2 determines whether or not any of the sequences Sb1 to Sbn-1 (partial sequence) ends (Step S29). The processing in Step S29 is repeated until any of the sequences Sb1 to Sbn-1 ends.

Figure 14:
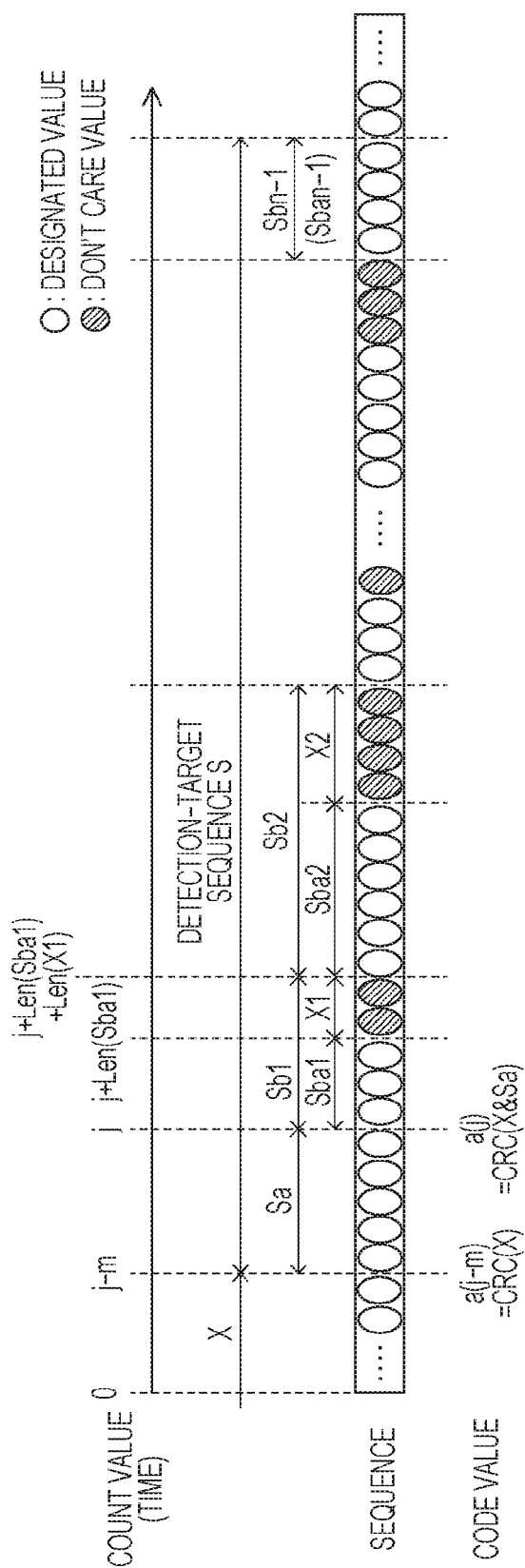
FIG. 14 is a view illustrating sequence end determination processing.

FIG. 14 is a view illustrating sequence end determination processing. It is assumed that the partial sequence end determination circuit 11h2 receives a signal indicating that the code value matches the expected value when the count value is j+Len(Sba1). At this time, the partial sequence end determination circuit 11h2 reads a length Len(X1) of the don't-care value sequence X1, which has the same identification information BPid as the sequence Sba1, from any of the registers 11b1 to 11bp. Here, Len(X1) is expressed as the number of counts (or the number of bytes). The partial sequence end determination circuit 11*h*2 holds a value found by adding Len(X1) to j+Len(Sba1).

When the count value is updated to j+Len(Sba1)+Len (X1), the partial sequence end determination circuit 11*h*2 outputs a signal indicating the end of the sequence Sba. When the partial sequence end determination circuit 11*h*2 outputs the signal indicating the end of any of the sequences Sb1 to Sbn−1, the final sequence determination circuit 11*h*3 determines whether or not the final sequence (sequence Sbn−1) ends (Step S30).

When the final sequence determination circuit 11*h*3 determines that the final sequence does not end, the processing in Step S26 and subsequent steps are performed again. For example, when the count value is j+Len(Sba1)+Len(X1) as illustrated in FIG. 14, only the sequence up to the sequence Sb1 ends and thus, the processing of calculating the expected value in Step S26 is performed. At this time, the expected value calculation circuit 11*f* refers to a value of the pointer Next as illustrated in FIG. 4 to acquire information on the next sequence Sb2. The expected value at end of the designated value sequence Sba2 in the sequence Sb2 is calculated based on the code value a(j+Len(Sba1)+Len(X1)) and the code value CRC(Sba2) of the sequence Sba2. The code value a(j+Len(Sba1)+Len(X1)) corresponds to CRC (X&Sa&Sb1).

When determining the end of the final sequence, the final sequence determination circuit 11*h*3 outputs a signal indicating detection of the detection-target sequence S, and stops operation of the user circuit 12 to be debugged using the signal (Step S31). In this manner, the processing of stopping the user circuit 12 at detection of the detection-target sequence is finished.

The final sequence determination circuit 11*h*3 outputs "1" and stops supply of a clock signal to the user circuit 12, thereby stopping operation of the user circuit 12. The final sequence determination circuit 11*h*3 may block inputting data to the user circuit 12 or outputting data from the user circuit 12 to stop the user circuit 12.

After that, for example, the debugger device 20 performs debugging including check of the signal state of each unit of the user circuit 12. An example in which a 5 bytes of detection-target sequence "AB??C" is detected by using the above debug method will be described below. "?" denotes the don't-care value, and other "A", "B", and "C" denote the designated value. It is given that the detection-target sequence is divided into three sequences Sa, Sb1, and Sb2: "A", "B??", and "C". It is assumed that the input data x of the user circuit 12 transitions as follows.

Figures 15, 16:
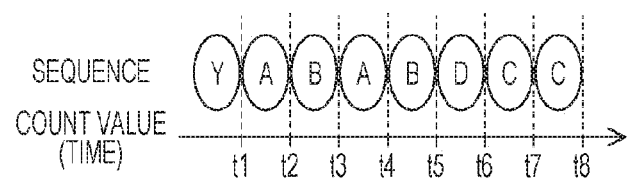
FIG. 15 is a view illustrating an example of transition of input data.
FIG. 16 is a view illustrating an example of detection results and end determination results of each sequence in detection-target sequence detection processing.

FIG. 15 is a view illustrating an example of transition of input data. In the example illustrated in FIG. 15, the input data x transitions in a sequence "YABABDCC". t1 to t8 each denotes a count value (corresponding to time).

When the above detection-target sequence is detected from such sequence of input data x, a detection result of each of the divided sequences Sa, Sba1 (a designated value sequence in the sequence Sb1, that is, "B"), and a detection result of Sb2 are as follows.

FIG. 16 is a view illustrating an example of the detection and end determination result of each sequence in the processing of detecting the detection-target sequence. FIG. 16 illustrates the detection results of the sequence Sa, Sba1, Sb2 and the end determination results of the sequences Sb1, Sb2 at each time. "1" indicates that the sequences Sa, Sba1, Sb2 are detected, or the sequence Sb1 ends. Since the sequence Sb2 includes no don't-care value, the detection result and the end determination result have the same value.

At Time t1, since the input data x is "Y", the sequence Sa is not detected, and the detection results of the sequences Sa, Sba1, and Sb2 and the end determination result of the sequence Sb1 are all "0".

At Time t2, since the input data x is "A", the first sequence detection circuit 11*e* detects the sequence Sa, and the detection result is "1". At Time t3, since the input data x is "B", the detection result of the sequence Sa is "0", but the detection result of the sequence Sba1 is "1". This is due to that the match determination circuit 11*h*1 determines that the expected value at the end of the sequence Sba1 matches the code value output from the code value calculation circuit 11*c*.

At Time t4, since the input data x is "A" again, the detection result of the sequence Sa is "1". The detection result of the sequence Sba1 returns to "0". At Time t5 later by two counts than the time of detection of the sequence Sba1, the end determination result of the sequence Sb1 is "1". This is because the partial sequence end determination circuit 11*h*2 detects an elapse of two counts corresponding to the length of the sequence X1 including the don't-care values "??". At Time t5, since the input data x is "B", the detection result of the sequence Sba1 is "1".

At Time t6, since the input data x is "D", both detection results of the sequences Sa, Sba are "0". The end determination result of the sequence Sb1 is also "0". At Time t7 later by two counts than the time of detection of the sequence Sba1 at Time t5 by two counts, the end determination result of the sequence Sb1 becomes "1" again.

Then, at Time t8, the input data x is "C", and the detection result and the end determination result of the sequence Sb2 becomes "1". That is, in the above example, at Time t8, the detection-target sequence is detected.

The semiconductor device 10, the debug circuit 11, and the debugger device 20 may achieve the same effect as the semiconductor device 1, the debug circuit 2, and the debugger device 4 in First embodiment. The processing of stopping the user circuit 12 may be performed based on the code value of each of the sequence Sa and the sequences Sba1 to Sban−1 in a plurality of detection-target sequences, and lengths of the sequence X1 to Xn−1 and therefore, the user circuit 12 may be stopped under a plurality of stop conditions.

Although the debug circuit, the semiconductor device, and the debug method according to an aspect of the disclosure has been described based on the embodiments, they are merely examples, and are not limited to the embodiments. All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A debug circuit, comprising:
   a memory configured to store, among code values calculated in accordance with a coding scheme that varies code values according to a signal sequence in a debug-target circuit, a first code value obtained by coding a leading first sequence of a plurality of sequences divided from a detection-target sequence detected from the signal sequence, a second code value obtained by coding a third sequence being a designated value sequence in each of two or more second sequences of the plurality of sequences, and a length of a fourth sequence being a don't-care value sequence in each of the second sequences;

a code value calculation circuit configured to calculate third code values by coding the signal sequence in accordance with the coding scheme;

a first sequence detection circuit configured to detect the first sequence based on comparison of the first code value with a difference between the current third code value and a fourth code value that is the third code value preceding the current third code value by a length of the first sequence;

an expected value calculation circuit configured to calculate an expected value of the third code value at the end of the third sequence based on the second code value and a fifth code value that is one of the third code values at a time when the first sequence or the second sequence is detected; and a determination circuit configured to detect the end of the second sequence based on a length of the fourth sequence when the third code value matches the expected value, notify the expected value calculation circuit of the detection of the second sequence, and output a detection signal indicating detection of the detection-target sequence when the end of all the second sequences is detected.

2. The debug circuit according to claim 1, wherein the coding scheme is a scheme that calculates code values having linearity.

3. The debug circuit according to claim 1, wherein the determination circuit comprises:
a first determination circuit configured to compare the third code value with the expected value and determine whether or not they match each other;
a second determination circuit configured to detect the end of the second sequence when the third code value is updated the number of times corresponding to the length of the fourth sequence, after the first determination circuit determines that the third code value and the expected value match each other; and
a third determination circuit configured to determine whether or not all the second sequences end based on the number of the second sequences, every time the second determination circuit detects the end of the second sequence.

4. The debug circuit according to claim 1, wherein the detection-target sequence is configured to represent a stop condition of the circuit, and
the determination circuit stops operation of the circuit according to the detection signal.

5. A semiconductor device comprising:
a debug-target circuit; and
a debug circuit, wherein
the debug circuit comprises:
a memory configured to store, among code values calculated in accordance with a coding scheme that varies code values according to a signal sequence in the debug-target circuit, a first code value obtained by coding a leading first sequence of a plurality of sequences divided from a detection-target sequence detected from the signal sequence, a second code value obtained by coding a third sequence being a designated value sequence in each of two or more second sequences of the plurality of sequences, and a length of a fourth sequence being a don't-care value sequence in each of the second sequences;
a code value calculation circuit configured to calculate third code values by coding the signal sequence in accordance with the coding scheme;
a first sequence detection circuit configured to detect the first sequence based on comparison of the first code value with a difference between the current third code value and a fourth code value that is the third code value preceding the current third code value by a length of the first sequence;
an expected value calculation circuit configured to calculate an expected value of the third code value at the end of the third sequence based on the second code value and a fifth code value that is one of the third code values at a time when the first sequence or the second sequence is detected; and
a determination circuit configured to detect the end of the second sequence based on a length of the fourth sequence when the third code value matches the expected value, notify the expected value calculation circuit of the detection of the second sequence, and output a detection signal indicating detection of the detection-target sequence when the end of all the second sequences is detected.

6. A debug method using a debugger device including a computer, and a semiconductor device including a circuit as a debug target, the method comprising:
causing the debugger device to:
divide a detection-target sequence detected from a signal sequence in the circuit into a plurality of sequences,
calculate a first code value by coding a leading first sequence in the plurality of sequences in accordance with a coding scheme that varies code values according to the signal sequence, and a second code value by coding a third sequence being a designated value sequence in each of two or more second sequences of the plurality of sequences, and
transmit the first code value, the second code value, and a length of a fourth sequence being a don't-care value sequence in each of the second sequences; and
causing the semiconductor device to:
receive the first code value, the second code value, and the length of the fourth sequence,
calculate third code values by coding the signal sequence in accordance with the coding scheme,
detect the first sequence based on comparison of the first code value with a difference between the current third code value and a fourth code value that is the third code value preceding the current third code value by a length of the first sequence,
calculate an expected value of the third code value at the end of the third sequence based on the second code value and a fifth code value that is one of the third code values at a time when the first sequence or the second sequence is detected, and
detect the end of the second sequence based on a length of the fourth sequence when the third code value matches the expected value, and output a detection signal indicating detection of the detection-target sequence when the end of all the second sequences is detected.

* * * * *